United States Patent
Cha et al.

(10) Patent No.: US 9,644,258 B2
(45) Date of Patent: May 9, 2017

(54) APPARATUS AND METHOD OF MANUFACTURING DISPLAY DEVICE

(71) Applicant: SAMSUNG DISPLAY CO., LTD., Yongin-si, Gyeonggi-do (KR)

(72) Inventors: Youmin Cha, Yongin-si (KR); Sangho Yun, Yongin-si (KR); Sungwoong Joo, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

(21) Appl. No.: 14/830,670

(22) Filed: Aug. 19, 2015

(65) Prior Publication Data

US 2016/0240403 A1      Aug. 18, 2016

(30) Foreign Application Priority Data

Feb. 16, 2015  (KR) .................. 10-2015-0023148

(51) Int. Cl.
  *H01L 51/00*    (2006.01)
  *H01L 21/687*   (2006.01)
  *H01L 21/677*   (2006.01)
  *C23C 14/24*    (2006.01)
  *H01L 21/67*    (2006.01)
  (Continued)

(52) U.S. Cl.
  CPC ............ *C23C 14/24* (2013.01); *C23C 14/042* (2013.01); *C23C 14/566* (2013.01);
  (Continued)

(58) Field of Classification Search
  CPC ............... H01L 51/0011; H01L 51/001; H01L 21/67207; H01L 21/67161;
  (Continued)

(56) References Cited

U.S. PATENT DOCUMENTS

2004/0245531 A1* 12/2004 Fuii .................... H01L 27/3267
                                                257/88
2008/0017109 A1*  1/2008 Chiang ................ C23C 14/042
                                                118/719
(Continued)

FOREIGN PATENT DOCUMENTS

JP    2010-80228 A      4/2010
JP    2020-080228 A  *  4/2010  ............. H01L 51/00
(Continued)

OTHER PUBLICATIONS

Translation of JP2010-080228 A (Asada et al) (Apr. 8, 2010) 18 pages.*

(Continued)

*Primary Examiner* — Caridad Everhart
(74) *Attorney, Agent, or Firm* — Lewis Roca Rothgerber Christie LLP (57) ABSTRACT

An apparatus for manufacturing a display device, the apparatus including a loading chamber configured to receive a substrate from outside, a transfer chamber connected to the loading chamber and including a robot arm configured to transport the substrate, a deposition chamber connected to the transfer chamber and configured to deposit a deposition material onto the substrate after the substrate is transported to the deposition chamber from the transfer chamber, a mask supply chamber connected to the deposition chamber and configured to supply, to the deposition chamber, one of a plurality of masks stacked in the mask supply chamber, and a station connected to the mask supply chamber and configured to supply the plurality of masks, one by one, to the mask supply chamber.

19 Claims, 5 Drawing Sheets

(51) Int. Cl.
*C23C 14/04* (2006.01)
*C23C 14/56* (2006.01)

(52) U.S. Cl.
CPC ...... *C23C 14/568* (2013.01); *H01L 21/67161* (2013.01); *H01L 21/67196* (2013.01); *H01L 21/67207* (2013.01); *H01L 51/001* (2013.01)

(58) Field of Classification Search
CPC . H01L 21/67196; C23C 14/54; C23C 14/541; C23C 14/566; C23C 14/24; C23C 14/042; C23C 14/568
USPC ............................................. 438/35; 118/721
See application file for complete search history.

(56) References Cited

U.S. PATENT DOCUMENTS

| | | |
|---|---|---|
| 2010/0279021 A1 | 11/2010 | Park et al. |
| 2010/0304025 A1 | 12/2010 | Hwang et al. |
| 2012/0094025 A1 | 4/2012 | Kim et al. |
| 2014/0084262 A1 | 3/2014 | Kim |
| 2014/0170785 A1* | 6/2014 | Kurita ..................... H01L 51/56 438/26 |

FOREIGN PATENT DOCUMENTS

| | | | |
|---|---|---|---|
| KR | 10-2010-0120081 A | 11/2010 | |
| KR | 10-2010-0130005 A | 12/2010 | |
| KR | 10-2012-0039944 A | 4/2012 | |
| KR | 10-2014-0039607 A | 4/2014 | |
| KR | 10-2014-0059003 A | 5/2014 | |
| KR | 2014-0059003 A * | 5/2014 | ............. H01L 51/56 |

OTHER PUBLICATIONS

Translation of KR 2014-0059003 A (Kang et al ) (May 15, 2014) (also published as KR101419355 B1) 18 pages.*

* cited by examiner

APPARATUS AND METHOD OF MANUFACTURING DISPLAY DEVICE

CROSS-REFERENCE TO RELATED APPLICATION

This application claims priority to and the benefit of Korean Patent Application No. 10-2015-0023148, filed on Feb. 16, 2015, in the Korean Intellectual Property Office, the disclosure of which is incorporated herein in its entirety by reference.

BACKGROUND

1. Field

Aspects of one or more exemplary embodiments relate to an apparatus and a method for manufacturing a display device.

2. Description of the Related Art

Electronic devices including display panels are widely used. Tablet PCs as well as small devices such as mobile phones are recently widely used as electronic devices. Also, TVs and monitors are commonly used electronic devices.

An electronic device includes a display unit for displaying visual information such as an image to a user in order to support various functions. Recently, as other parts for driving the display unit have been miniaturized, an area occupied by the display unit in the electronic device has gradually increased. Accordingly, a structure that may change from a flat state to a state where the structure is bent at a predetermined angle has been developed.

SUMMARY

Additional aspects will be set forth in part in the description which follows and, in part, will be apparent from the description, or may be learned by practice of the presented embodiments.

According to one or more exemplary embodiments, there is provided an apparatus for manufacturing a display device, the apparatus including: a loading chamber configured to receive a substrate from outside; a transfer chamber connected to the loading chamber and including a robot arm configured to transport the substrate; a deposition chamber connected to the transfer chamber and configured to deposit a deposition material onto the substrate after the substrate is transported to the deposition chamber from the transfer chamber; a mask supply chamber connected to the deposition chamber and configured to supply, to the deposition chamber, one of a plurality of masks stacked in the mask supply chamber; and a station connected to the mask supply chamber and configured to supply the plurality of masks, one by one, to the mask supply chamber.

In an embodiment, the transfer chamber includes: a first transfer chamber; and a second transfer chamber spaced from the first transfer chamber and connected to the first transfer chamber via a connection chamber, and wherein the deposition chamber includes: a first deposition chamber connected to the first transfer chamber; and a second deposition chamber connected to the second transfer chamber and spaced from the first deposition chamber.

In an embodiment, the mask supply chamber includes: a first mask supply chamber connected to the first deposition chamber; and a second mask supply chamber connected to the second deposition chamber.

In an embodiment, the mask supply chamber is connected to both the first deposition chamber and the second deposition chamber.

In an embodiment, the mask supply chamber includes a second cassette configured to hold the plurality of masks and configured to move upward and downward.

In an embodiment, the station includes: a station chamber having a space therein; a first cassette configured to receive the plurality of masks, the first cassette being in the station chamber; and a first cassette mover in the station chamber and configured to move the first cassette.

In an embodiment, the mask supply chamber includes a shuttle configured to receive the plurality of masks, and is configured to transport one of the plurality of masks loaded thereon.

In an embodiment, the shuttle is configured to move into the mask supply chamber and the deposition chamber.

In an embodiment, the apparatus further includes a first mask mover in the mask supply chamber, wherein the first mask mover is configured to transport one of the plurality of masks from the station to the mask supply chamber or to transport one of the plurality of masks from the mask supply chamber to the station.

In an embodiment, a pressure in the mask supply chamber is varied between an atmospheric pressure and a pressure in a vacuum state.

According to one or more exemplary embodiments, there is provided a method of manufacturing a display device, the method including: transporting a substrate from a transfer chamber to a deposition chamber; transporting, to the deposition chamber, a mask selected from among a plurality of masks that are stacked in a mask supply chamber connected to the deposition chamber and aligning the selected mask with the substrate; and discharging the deposition material from a deposition source of the deposition chamber and depositing the deposition material through the selected mask and onto the substrate.

In an embodiment, the method further includes supplying the mask to the mask supply chamber via a station connected to the mask supply chamber.

In an embodiment, the station includes: a station chamber having a space therein; a first cassette configured to receive the plurality of masks, the first cassette being in the station chamber; and a first cassette mover in the station chamber and configured to move the first cassette.

In an embodiment, the transfer chamber includes: a first transfer chamber; and a second transfer chamber spaced from the first transfer chamber, wherein a connection chamber connects the first transfer chamber and the second transfer chamber, and wherein the deposition chamber includes: a first deposition chamber connected to the first transfer chamber; and a second deposition chamber connected to the second transfer chamber and spaced apart from the first deposition chamber.

In an embodiment, the mask supply chamber is connected to both the first deposition chamber and the second deposition chamber.

In an embodiment, the mask supply chamber includes: a first mask supply chamber connected to the first deposition chamber; and a second mask supply chamber connected to the second deposition chamber.

In an embodiment, the transporting of the selected mask includes loading the selected mask on a shuttle included in the mask supply chamber and transporting the selected mask loaded on the shuttle.

In an embodiment, the transporting of the selected mask includes moving the shuttle into the mask supply chamber and the deposition chamber.

In an embodiment, the method further includes varying a pressure in the mask supply chamber between an atmospheric pressure and a pressure in a vacuum state.

BRIEF DESCRIPTION OF THE DRAWINGS

These and/or other aspects will become apparent and more readily appreciated from the following description of the exemplary embodiments, taken in conjunction with the accompanying drawings in which.

DETAILED DESCRIPTION

The inventive concept may include various embodiments and modifications, and exemplary embodiments thereof will be illustrated in the drawings and will be described herein in detail. The effects and features of the inventive concept and the accompanying methods thereof will become apparent from the following description of the embodiments, taken in conjunction with the accompanying drawings. However, the inventive concept is not limited to the embodiments described below, and may be embodied in various modes.

Reference will now be made in detail to embodiments, examples of which are illustrated n the accompanying drawings. In the drawings, the same elements are denoted by the same reference numerals, and a repeated explanation thereof will not be given.

Figure 1:
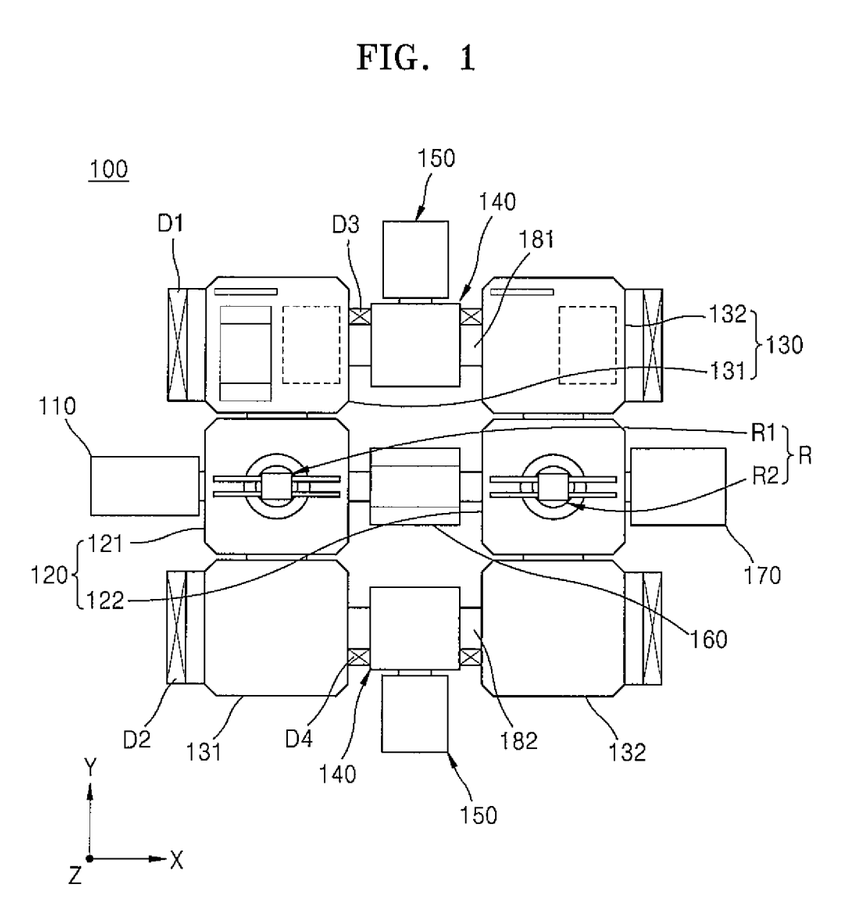
FIG. 1 is a conceptual view illustrating an apparatus for manufacturing a display device, according to an exemplary embodiment.
Figure 2:
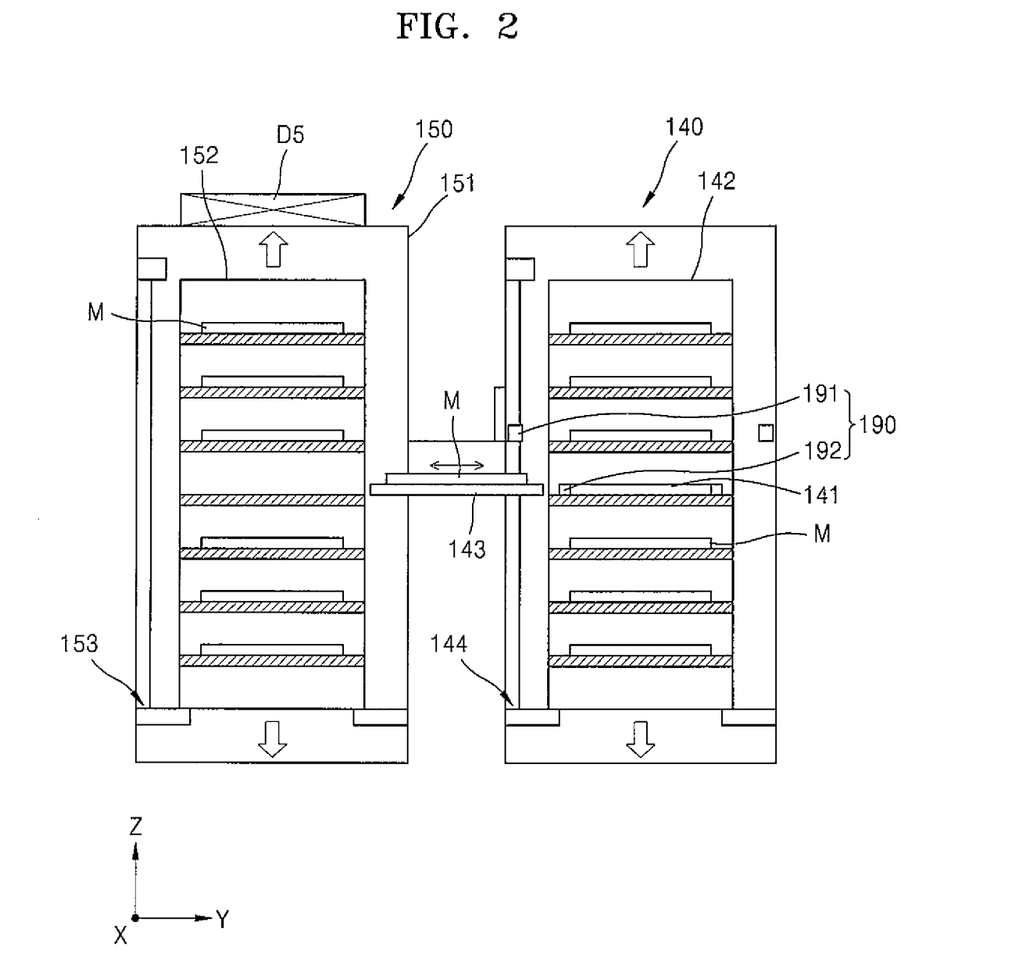
FIG. 2 is a conceptual view illustrating a mask supply chamber and a station of FIG. 1, according to an exemplary embodiment.
Figure 3:
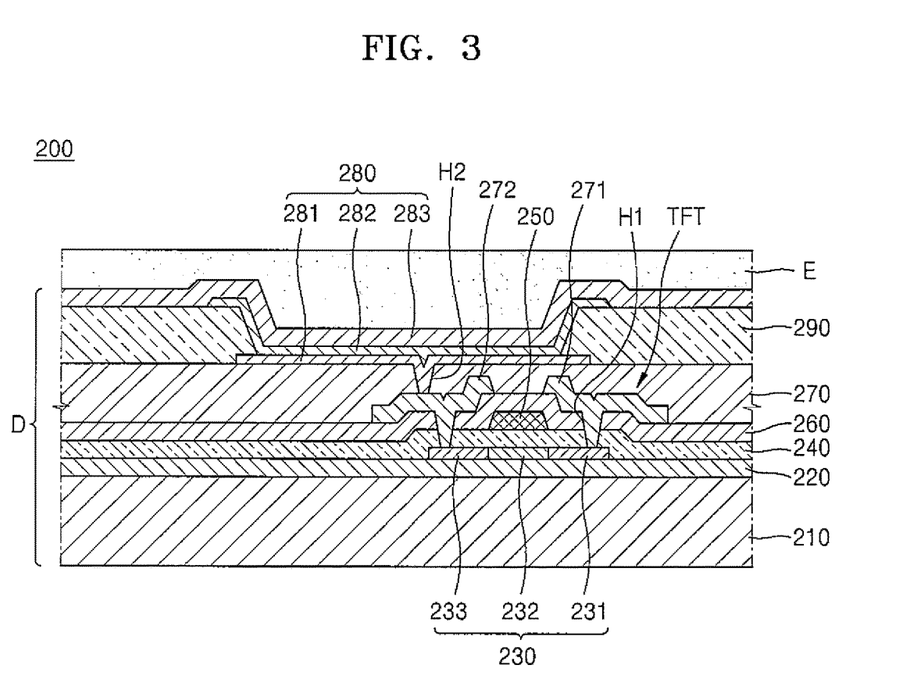
FIG. 3 is a cross-sectional view illustrating a part of the display device that is manufactured by using the apparatus of FIG. 1, according to an exemplary embodiment.

FIG. 1 is a conceptual view illustrating an apparatus 100 for manufacturing a display device 200, according to an exemplary embodiment. FIG. 2 is a conceptual view illustrating a mask supply chamber 140 and a station 150 of the embodiment of FIG. 1, according to an exemplary embodiment. FIG. 3 is a cross-sectional view illustrating a part of the display device 200 that is manufactured by using the apparatus 100 of the embodiment of FIG. 1, according to an exemplary embodiment.

Referring to FIGS. 1 through 3, the apparatus 100 may form various films or layers of the display device 200 by using a deposition process. However, the following will focus on a case where the apparatus 100 forms an intermediate layer 282 by using a deposition process, for convenience of explanation.

The apparatus 100 may include a loading chamber 110, a transfer chamber 120, a deposition chamber 130, a connection chamber 160, the mask supply chamber 140, the station 150, and an unloading chamber 170.

A substrate 210 may be supplied from the outside to the loading chamber 110, and the loading chamber 110 may temporarily store the substrate 210 therein and then may supply the substrate 210 to the transfer chamber 120.

The transfer chamber 120 may receive the substrate 210 from the loading chamber 110 and may temporarily store the substrate 210 therein. Also, the transfer chamber 120 may be connected to other chambers and may supply the substrate 210 to the other chambers. In this case, a robot arm R for conveying (e.g., transporting) the substrate 210 may be provided in the transfer chamber 120.

The robot arm R may be of a single-type where the robot arm R is formed only on one side or a dual-type where the robot arm R is formed on both sides. When the robot arm R is of a dual-type, the robot arm R may support one substrate 210 on which deposition has been performed at one side and may support another substrate 210 on which deposition is to be performed at the other side. The following will focus on a case where the robot arm R is of a dual-type, for convenience of explanation.

The robot arm R may include a first robot arm R1 that is provided in a first transfer chamber 121 and a second robot arm R2 that is provided in a second transfer chamber 122.

The transfer chamber 120 may include the first transfer chamber 121 that is connected to the loading chamber 110 and the second transfer chamber 122 that is spaced apart from the first transfer chamber 121. In this case, the first transfer chamber 121 and the second transfer chamber 122 may be formed to be the same as or similar to each other.

The connection chamber 160 may be disposed between the first transfer chamber 121 and the second transfer chamber 122 and may connect the first transfer chamber 121 and the second transfer chamber 122. In this case, the connection chamber 160 may act as a path through which the substrate 210 is conveyed (e.g., transported) from the first transfer chamber 121 to the second transfer chamber 122.

A plurality of the deposition chambers 130 may be provided. In this case, a deposition material may be deposited on the substrate 210 in each of the plurality of deposition chambers 130. In particular, each deposition chamber 130 may evaporate the deposition material by using a deposition source and then may deposit the deposition material on the substrate 210 through a mask M. For example, the deposition chamber 130 may deposit the intermediate layer 282.

The deposition chamber 130 may include a first deposition chamber 131 that is connected to the first transfer chamber 121 and a second deposition chamber 132 that is connected to the second transfer chamber 122. In this case, the first deposition chamber 131 and the second deposition chamber 132 may be formed to be the same as or similar to each other, and may deposit the same deposition material on the substrates 210. Alternatively, the first deposition chamber 131 and the second deposition chamber 132 may deposit different deposition materials on the substrates 210. However, the following will focus on a case where different deposition materials are deposited on the substrates 210, for convenience of explanation.

A plurality of the first deposition chambers 131 and a plurality of the second deposition chambers 132 may be provided. In this case, each of the plurality of first deposition chambers 131 may be connected to the first transfer chamber 121. Also, each of the plurality of second deposition chambers 132 may be connected to the second transfer chamber 122.

The plurality of first deposition chambers 131 may face each other. That is, the first deposition chambers 131 may face each other about the first transfer chamber 121.

Also, the plurality of second deposition chambers 132 may face each other about the second transfer chamber 122, like the first deposition chambers 131.

A first door D1 and a second door D2 may be respectively provided in the first deposition chamber 131 and the second deposition chamber 132, and thus when a shuttle 141 is out of order, the shuttle 141 may be replaced or repaired. Also, the masks supply chamber 140 and the first deposition chamber 131 may be connected to each other via a first connector 181. In this case, the first connector 181 may be formed so that one mask M is moved, and a gate valve may be provided. Also, the first connector 181 may include a third door D3 so that when the shuttle 141 is out of order, the shuttle 141 is replaced or repaired.

The mask supply chamber 140 and the second deposition chamber 132 may be connected to each other via a second connector 182. In this case, the second connector 182 may be formed so that one mask M is moved, and a gate value may be provided. Also, a space where the shuttle 141 may stay may be formed in the second connector 182, and a fourth door D4 may be provided in the space so that when the shuttle 141 is out of order, the shuttle 141 is replaced or repaired.

The first deposition chamber 131, the second deposition chamber 132, the first transfer chamber 121, and the second transfer chamber 122 may be arranged in a polygonal shape. For example, the first deposition chamber 131, the second deposition chamber 132, the first transfer chamber 121, and the second transfer chamber 122 may be arranged to have a quadrangular shape. In this case, the first deposition chamber 131 and the second deposition chamber 132 may be disposed parallel to each other.

The mask supply chamber 140 may be provided between the first deposition chamber 131 and the second deposition chamber 132. In this case, the mask supply chamber 140 may be connected to the first deposition chamber 131 and the second deposition chamber 132 so that the masks M are respectively supplied to the first deposition chamber 131 and the second deposition chamber 132.

Also, the mask supply chamber 140 may directly receive the mask M from the outside and may supply the mask M to the first deposition chamber 131 or the second deposition chamber 132. Alternatively, the station 150 may be connected to the mask supply chamber 140, and the mask supply chamber 140 may receive the mask M from the station 150 and then may supply the mask M to the first deposition chamber 131 or the second deposition chamber 132. The following will focus on a case where the station 150 is connected to the mask supply chamber 140, for convenience of explanation.

The mask supply chamber 140 may include a second cassette 142 in which a plurality of the masks M are stacked. Also, the mask supply chamber 140 may include a first mask mover 143 that moves the masks M from a first cassette 152 to the second cassette 142. In this case, the first mask mover 143 may be provided to linearly move in the mask supply chamber 140. For example, the first mask mover 143 may move upward and downward along an inner wall of the mask supply chamber 140, and may linearly move from the mask supply chamber 140 to the station 150 at a specific position. (For example, the first mask mover 143 may move upward and downward along a Z-axis of FIGS. 1 and 2 and may linearly move along a Y-axis of FIGS. 1 and 2). In this case, the first mask mover 143 may be formed in a rail shape.

The mask supply chamber 140 may include the shuttle 141 that is seated in the second cassette 142. The second cassette 142 may linearly move in the mask supply chamber 140. In this case, a second cassette mover 144 for linearly moving the second cassette 142 may be provided in the mask supply chamber 140.

A plurality of the shuttles 141 that are seated in the second cassette 142 may be provided, and may linearly move in the mask supply chamber 140 as the second cassette 142 moves. Also, each of the shuttles 141 may move in a direction that is perpendicular to a vertical direction of the mask supply chamber 140, for example, a width direction or a longitudinal direction of the mask supply chamber 140. In particular, in this case, the shuttle 141 may move from the mask supply chamber 140 to the first deposition chamber 131, or may move from the first deposition chamber 131 to the mask supply chamber 140.

After the masks M are seated, the plurality of shuttles 141 may convey (e.g., transport) the masks M from the mask supply chamber 140 to the first deposition chamber 131 or may convey the masks M from the mask supply chamber 140 to the second deposition chamber 132. In this case, because the shuttles 141 support edges of the masks M, the masks M may be prevented from being deformed while the masks M are conveyed or incidence of mask deformation may be reduced.

A second mask mover 190 for conveying each mask M may be provided between the mask supply chamber 140 and the first deposition chamber 131 or between the mask supply chamber 140 and the second deposition chamber 132. In this case, the second mask mover 190 may be formed as a linear motor. In an embodiment, the second mask mover 190 may include: an electromagnet member 191 that has a rail shape and is connected to the mask supply chamber 140, the first connector 181, and the first deposition chamber 131 or to the mask supply chamber 140, the second connector 182, and the second deposition chamber 132; and a magnet member 192 that is provided on each shuttle 141. In this case, the electromagnet member 191 may convey the shuttle 141 by applying an electromagnetic force to the magnet member 192. Also, the electromagnet member 191 and the magnet member 192 are not limited to positions described above and may be reversely provided.

The station 150 may be connected to the mask supply chamber 140 and may supply the mask M to the mask supply chamber 140. In this case, the station 150 may include a station chamber 151 that is connected to the mask supply chamber 140 and the first cassette 152 that may be inserted into or removed from the station chamber 151. Also, the station 150 may include a first cassette mover 153 that is provided in the station chamber 151 and moves the first cassette 152.

The station chamber 151 may be connected to the mask supply chamber 140. In this case, pressures in the station chamber 151 and the mask supply chamber 140 may be atmospheric pressures.

The station chamber 151 and the mask supply chamber 140 may be connected to each other so that one of the masks M that are stacked in the first cassette 152 is moved. In particular, the mask supply chamber 140 may be maintained in a vacuum state before the mask supply chamber 140 supplies the mask M to the first deposition chamber 131. The mask supply chamber 140 may quickly reach a vacuum state when a space between the station chamber 151 and the mask supply chamber 140 is reduced or minimized.

The first cassette 152 may be supplied from the outside to the station chamber 151. In this case, the station chamber 151 may include a fifth door D5 that opens when the first cassette 152 is inserted or removed. In particular, the fifth door D5 may be formed at an upper portion of the station chamber 151.

The first cassette 152 may be formed to include multiple steps and may temporarily store or support the plurality of masks M. In particular, the plurality of masks M may be concurrently (e.g., simultaneously) loaded in the first cassette 152.

The first cassette mover 153 may linearly move the first cassette 152 in the station chamber 151. For example, the first cassette mover 153 may move the first cassette 152 in a vertical direction of the station chamber 151. Alternatively, the first cassette mover 153 may move the first cassette 152 in a longitudinal direction or a width direction of the station chamber 151. In this case, the first cassette mover 153 may move the first cassette 152 to the upper portion of the station chamber 151 where the fifth door D5 is formed or may move the first cassette 152 from the fifth door D5 to a central portion of the station chamber 151.

The first cassette mover 153 may be formed in any one of various suitable ways. For example, the first cassette mover 153 may include a shaft that is connected to the first cassette 152 and a cylinder that is connected to the shaft and moves the shaft. Alternatively, the first cassette mover 153 may include a seating plate on which the first cassette 152 is seated and a cylinder that is connected to the seating plate and whose length varies. Alternatively, the first cassette mover 153 may include a seating plate on which the first cassette 152 is seated, a gear unit that is connected to the seating plate, and a motor that is connected to the gear unit and varies (e.g., changes) a position of the seating plate by rotating the gear unit. However, the first cassette mover 153 is not limited thereto, and may include any apparatus and structure that may move the first cassette 152 in the station chamber 151.

An operation of the apparatus 100 will now be explained. First, a plurality of layers may be formed on the substrate 210 and then the substrate 210 may be conveyed to the loading chamber 110.

In an embodiment, a thin-film transistor (TFT) may be formed on the substrate 210 and a passivation film 270 may be formed to cover the TFT.

In this case, the substrate 210 may be formed of a glass material. However, the present exemplary embodiment is not limited thereto, and the substrate 210 may be formed of a plastic material, or a metal material such as SUS, titanium (Ti), and/or the like. Alternatively, the substrate 210 may be formed of polyimide (PI). The following will focus on a case where the substrate 210 is formed of a glass material, for convenience of explanation.

A buffer layer 220 formed of an organic compound and/or an inorganic compound such as SiOx (x≥1) or SiNx (x≥1) may be further formed on a top surface of the substrate 210.

After an active layer 230 that has a set or predetermined pattern is formed on the buffer layer 220, the active layer 230 is covered by a gate insulating layer 240. The active layer 230 includes a source region 231 and a drain region 233, and a channel region 232 that is formed between the source region 231 and the drain region 233.

The active layer 230 may be formed to include various suitable materials. For example, the active layer 230 may include an inorganic semiconductor material such as amorphous silicon, crystalline silicon, and/or the like. Alternatively, the active layer 230 may include an oxide semiconductor. Alternatively, the active layer 230 may include an organic semiconductor material. However, the following will focus on a case where the active layer 230 is formed of amorphous silicon, for convenience of explanation.

The active layer 230 may be formed by forming an amorphous silicon film on the buffer layer 220, crystallizing the amorphous silicon film to form a polycrystalline silicon film, and patterning the polycrystalline silicon film. The source region 231 and the drain region 233 of the active layer 230 are doped with impurities according to a type of the TFT such as a driving TFT or a switching TFT.

A gate electrode 250 that corresponds to the active layer 230 and an interlayer insulating layer 260 that covers the gate electrode 250 are formed on a top surface of the gate insulating layer 240.

After a contact hole H1 is formed in the interlayer insulating layer 260 and the gate insulating layer 240, a source electrode 271 and a drain electrode 272 are formed on the interlayer insulating layer 260 to respectively contact the source region 231 and the drain region 233, thereby completing the TFT.

The passivation film 270 is formed on the TFT, and a pixel electrode 281 of an organic light-emitting device (OLED) 280 is formed on the passivation film 270. The pixel electrode 281 contacts the drain electrode 272 of the TFT through a via-hole H2 that is formed in the passivation film 270. The passivation film 270 may be formed of an inorganic material and/or an organic material to have a single-layer structure or a multi-layer structure. The passivation film 270 may be formed as a planarization film having a flat top surface irrespective of a curved shape of a bottom surface or may be formed to have a curved top surface that conforms to the curved shape of the bottom surface. The passivation film 270 may be formed of a transparent insulating material in order to obtain a resonance effect.

After the pixel electrode 281 is formed on the passivation film 270, a pixel-defining film 290 is formed of an organic material and/or an inorganic material to cover the pixel electrode 281 and the passivation film 270, and is opened to expose the pixel electrode 281.

The intermediate layer 282 and a counter electrode 283 are formed at least on the pixel electrode 281.

The pixel electrode 281 functions as an anode and the counter electrode 283 functions as a cathode. However, in other embodiments, polarities of the pixel electrode 281 and the counter electrode 283 may be reversed.

The pixel electrode 281 and the counter electrode 283 are insulated from each other by the intermediate layer 282. An organic emission layer emits light when voltages having different polarities are applied to the intermediate layer 282.

The intermediate layer 282 may include the organic emission layer. Alternatively, the intermediate layer 282 may include the organic emission layer, and may further include at least one from among a hole injection layer (HIL), a hole transport layer (HTL), an electron transport layer (ETL), and an electron injection layer (EIL).

One unit pixel may include a plurality of subpixels, and the plurality of subpixels may emit light of various colors. For example, the plurality of subpixels may include red, green, and blue subpixels that respectively emit red light, green light, and blue light or may include subpixels that emit red light, green light, blue light, and white light.

When the substrate 210 is introduced into the loading chamber 110, the first robot arm R1 of the first transfer chamber 121 may convey the substrate 210 in the first deposition chamber 131 to the first transfer chamber 121. The first robot arm R1 of the first transfer chamber 121 may convey the conveyed substrate 210 from the first transfer chamber 121 to the connection chamber 160. Alternatively, the first robot arm R1 may maintain a state where the first robot arm R1 supports the conveyed substrate 210. In this case, the mask M in the first deposition chamber 131 may be conveyed through the shuttle 141 to the mask supply chamber 140. The mask M that is seated on the shuttle 141 may be disposed in the mask supply chamber 140. In particular, the second cassette 142 in which the mask M that has been completely used is seated may move upward and downward in the mask supply chamber 140, and the mask M may be stored in the second cassette 142.

A new mask M may be supplied through the first mask mover 143 from the station chamber 151 to the mask supply chamber 140. In this case, the mask M that has been seated in the second cassette 142 may be conveyed from the mask supply chamber 140 to the first deposition chamber 131. In an embodiment, the shuttle 141 may be conveyed through the second mask mover 190 from the mask supply chamber 140 to the first deposition chamber 131.

Also, the first robot arm R1 of the first transfer chamber 121 may convey the substrate 210 that has been supplied from the loading chamber 110 from the first transfer chamber 121 to the first deposition chamber 131. In this case, if the first robot arm R1 supports the substrate 210 on which deposition has been completed in the first deposition chamber 131, before the first robot arm R1 conveys a new substrate 210 from the first transfer chamber 121 to the first deposition chamber 131, the first robot arm R1 may convey the substrate 210 on which deposition has been completed in the first deposition chamber to the connection chamber 160.

When the substrate 210 is introduced into the first deposition chamber 131, deposition may be performed in the first deposition chamber 131. In this case, at least one layer from among layers of the intermediate layer 282 may be formed in the first deposition chamber 131.

The substrate 210 in the connection chamber 160 may be conveyed to the second transfer chamber 122. In this case, the mask M may be conveyed from the station chamber 151 to the mask supply chamber 140, and then may be conveyed to the second deposition chamber 132. A method of conveying the mask M is the same as or similar to that described above, and thus a detailed explanation thereof may not be given.

Also, like the first robot arm R1 of the first transfer chamber 121, the second robot arm R2 of the second transfer chamber 122 may convey the substrate 210 on which deposition has been completed from the second deposition chamber 132 to the unloading chamber 170, or may convey the substrate 210 on which deposition has been completed from the second deposition chamber 132 and maintain a state where the second robot arm R2 supports the conveyed substrate 210. The following will focus on a case where the substrate 210 on which deposition has been completed is conveyed from the second transfer chamber 122 to the unloading chamber 170 through the second robot arm R2, for convenience of explanation.

The second robot arm R2 of the second transfer chamber 122 may convey the substrate 210 of the connection chamber 160 to the second transfer chamber 122 and then may convey the substrate 210 back to the second deposition chamber 132. A deposition material may be deposited on the substrate 210 in the second deposition chamber 132, like in the first deposition chamber 131.

The above processes may be repeatedly performed. In this case, a deposition process of the substrate 210 on which a deposition process has been completed in the first deposition chamber 131 may be performed in the second deposition chamber 132, and a deposition process of a new substrate 210 may be performed in the first deposition chamber 131. In particular, deposition processes may be concurrently (e.g., simultaneously) performed in the first deposition chamber 131 and the second deposition chamber 132, and the mask supply chamber 140 may provide the masks M to the first deposition chamber 131 and the second deposition chamber 132.

The substrates 210 on which deposition has been completed in the first deposition chamber 131 and the second deposition chamber 132 may be conveyed to the unloading chamber 170 through the second robot arm R2 of the second transfer chamber 122. In this case, the unloading chamber 170 may discharge the substrates 210 to the outside, or may be connected to an apparatus for performing another process and may convey the substrates 210 to the apparatus.

When a deposition material is completely deposited on the substrate 210, a thin-film encapsulation layer E may be formed on the counter electrode 283. In this case, the thin-film encapsulation layer E may include a plurality of inorganic layers, or may include an inorganic layer and an organic layer.

An uppermost layer of the thin-film encapsulation layer E that is exposed to the outside may be an inorganic layer in order to prevent or substantially prevent moisture from entering the OLED 280.

The thin-film encapsulation layer E may include at least one sandwich structure in which at least one organic layer is inserted between at least two inorganic layers. Alternatively, the thin-film encapsulation layer E may include at least one sandwich structure in which at least one inorganic layer is inserted between at least two organic layers. Alternatively, the thin-film encapsulation layer E may include a sandwich structure in which at least one organic layer is inserted between at least two inorganic layers, and a sandwich structure in which at least one inorganic layer is inserted between at least two organic layers.

Accordingly, in the apparatus 100 and a method of manufacturing the display device 200, because the mask supply chamber 140 directly supplies the mask M during a deposition process, a time taken to manufacture the display device 200 may be reduced and a process of manufacturing the display device 200 may be simplified.

In the apparatus 100 and the method of manufacturing the display device 200, because the robot arm R that is provided in each of the first transfer chamber 121 and the second transfer chamber 122 may not convey the mask M, a load applied to the robot arm R may be reduced or minimized.

Figure 4:
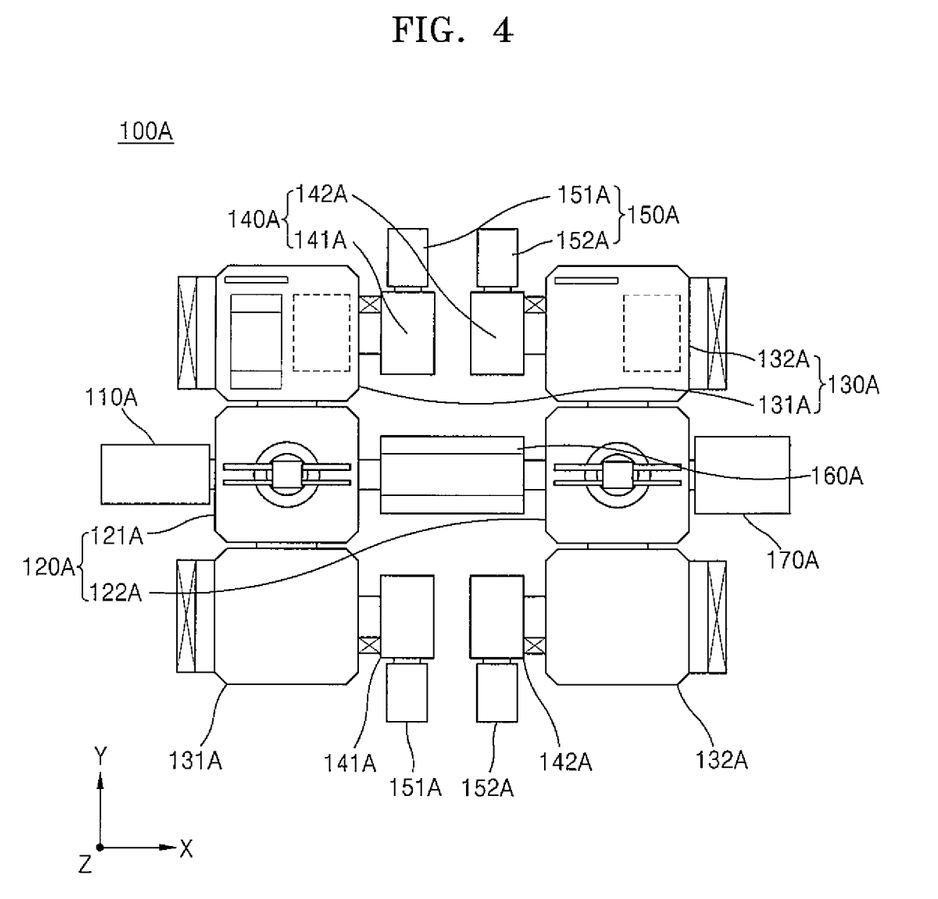
FIG. 4 is a conceptual view illustrating an apparatus for manufacturing the display device, according to another exemplary embodiment.

FIG. 4 is a conceptual view illustrating an apparatus 100A for manufacturing the display device 200, according to another exemplary embodiment.

Referring to FIG. 4, the apparatus 100A may include a loading chamber 110A, a transfer chamber 120A, a deposition chamber 130A, a connection chamber 160A, a mask supply chamber 140A, a station 150A, and an unloading chamber 170A.

The transfer chamber 120A may include a first transfer chamber 121A and a second transfer chamber 122A, and the deposition chamber 130A may include a first deposition chamber 131A and a second deposition chamber 132A.

In this case, the loading chamber 110A, the transfer chamber 120A, the deposition chamber 130A, the connection chamber 160A, and the unloading chamber 170A are respectively the same as or similar to the loading chamber 110, the transfer chamber 120, the deposition chamber 130, the connection chamber 160, and the unloading chamber 170 of the embodiments of FIGS. 1 through 3, and thus a detailed explanation thereof may not be given.

The mask supply chamber 140A may include a first mask supply chamber 141A that is connected to the first deposition chamber 131A (and, e.g., not the second deposition chamber 132A). Also, the mask supply chamber 140A may include a second mask supply chamber 142A that is connected to the second deposition chamber 132A (and, e.g., not the first deposition chamber 131A). In this case, the first mask supply chamber 141A and the second mask supply chamber 142A are the same as or similar to the mask supply chamber 140 of the embodiments of FIGS. 1 through 3, and thus a detailed explanation thereof may not be given.

The first mask supply chamber 141A and the second mask supply chamber 142A may face each other. That is, the first mask supply chamber 141A and the second mask supply chamber 142A may be disposed between the first deposition chamber 131A and the second deposition chamber 132A.

The station 150A may be connected to the mask supply chamber 140A in any one of various suitable ways. For example, the station 150A may be connected to both the first mask supply chamber 141A and the second mask supply chamber 142A. Alternatively, the station 150A may be individually connected to each of the first mask supply chamber 141A and the second mask supply chamber 142A. However, the following will focus on a case where the station 150A is individually connected to each of the first mask supply chamber 141A and the second mask supply chamber 142A, for convenience of explanation.

The station 150A may include a first station 151A that is connected to the first mask supply chamber 141A (and, e.g., not the second mask supply chamber 142A) and a second station 152A that is connected to the second mask supply chamber 142A (and, e.g., not the first mask supply chamber 141A). In this case, the first station 151A and the second station 152A are the same or substantially the same as the station 150 of the embodiments of FIGS. 1 through 3, and thus a detailed explanation thereof may not be given.

An operation of the apparatus 100A will now be explained. First, the substrate 210 may be introduced into the first transfer chamber 121A through the loading chamber 110A and then may be conveyed to the first deposition chamber 131A. In this case, the mask M that has been used in the first deposition chamber 131A may be seated on a shuttle that is moved from the first mask supply chamber 141A and may be conveyed to the first mask supply chamber 141A. Also, the substrate 210 on which deposition has been completed in the first deposition chamber 131A may be conveyed by the first robot arm R1 from the first deposition chamber 131A to the first transfer chamber 121A.

A new mask M may be conveyed from the first station 151A through the first mask supply chamber 141A to the first deposition chamber 131A. A deposition process may be performed on the substrate 210 in the first deposition chamber 131A.

The substrate 210 on which the deposition process has been completed in the first deposition chamber 131A may be conveyed from the first deposition chamber 131A through the first transfer chamber 121A to the connection chamber 160A. The substrate 210 may be conveyed from the connection chamber 160A through the second transfer chamber 122A to the second deposition chamber 132A.

In this case, the mask M that has been used in the second deposition chamber 132A may be conveyed to the second mask supply chamber 142A as described above, and the substrate 210 on which deposition has been completed in the second deposition chamber 132A may be conveyed by the second robot arm R2 from the second deposition chamber 132A to the second transfer chamber 122A.

Also, a new mask M may be conveyed from the second mask supply chamber 142A to the second deposition chamber 132A. Next, a deposition process may be performed in the second deposition chamber 132A.

The substrate 210 on which the deposition process has been completed may be conveyed from the second deposition chamber 132A through the second transfer chamber 122A to the unloading chamber 170A.

Accordingly, the apparatus 100A and a method of manufacturing the display device 200 may reduce a time taken to manufacture the display device 200 during a deposition process and may simplify a process of manufacturing the display device 200.

In the apparatus 100A and the method of manufacturing the display device 200, because the robot arm R that is provided in each of the first transfer chamber 121A and the second transfer chamber 122A may not convey the mask M, a load applied to the robot arm R may be reduced or minimized.

Figure 5:
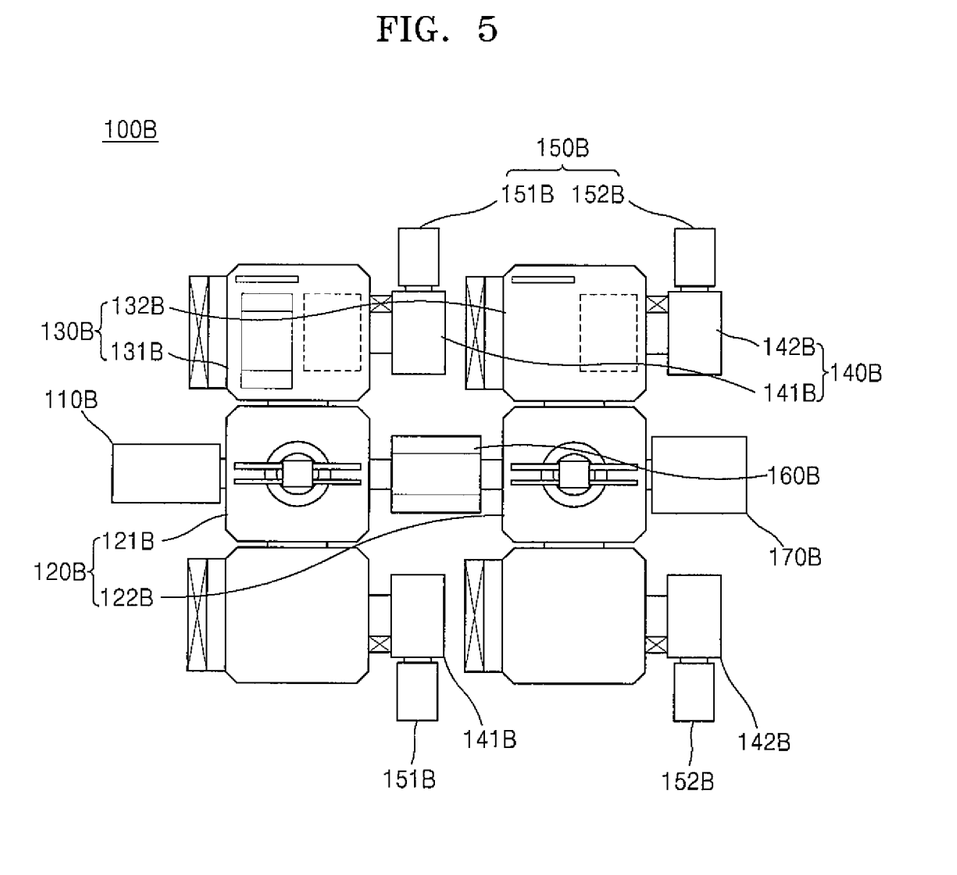
FIG. 5 is a conceptual view illustrating an apparatus for manufacturing the display device, according to another exemplary embodiment.

FIG. 5 is a conceptual view illustrating an apparatus 100B for manufacturing the display device 200, according to another exemplary embodiment.

Referring to FIG. 5, the apparatus 100B may include a loading chamber 110B, a transfer chamber 120B, a deposition chamber 130B, a connection chamber 160B, a mask supply chamber 140B, a station 150B, and an unloading chamber 170B.

The transfer chamber 120B may include a first transfer chamber 121B and a second transfer chamber 122B, and the deposition chamber 130B may include a first deposition chamber 131B and a second deposition chamber 132B.

In this case, the loading chamber 110B, the transfer chamber 120B, the deposition chamber 130B, the connection chamber 160B, and the unloading chamber 170B are respectively the same as or similar to the loading chamber 110, the transfer chamber 120, the deposition chamber 130, the connection chamber 160, and the unloading chamber 170 of the embodiments of FIGS. 1 through 3, and thus a detailed explanation thereof may not be given.

The mask supply chamber 140B may include a first mask supply chamber 141B that is connected to the first deposition chamber 131B (and, e.g., not the second deposition chamber 132B). Also, the mask supply chamber 140B may include a second mask supply chamber 142B that is connected to the second deposition chamber 132B (and, e.g., not the first deposition chamber 131B). In this case, the first mask supply chamber 141B and the second mask supply chamber 142B are the same as or similar to the mask supply chamber 140 of the embodiments of FIGS. 1 through 3, and thus a detailed explanation thereof may not be given.

The first mask supply chamber 141B and the second mask supply chamber 142B may be disposed in the same direction. For example, when the first mask supply chamber 141B is disposed on the right side of the first deposition chamber 131B, the second mask supply chamber 142B may be disposed on the right side of the second deposition chamber 132B. Also, when the first mask supply chamber 141B is disposed on the left side of the first deposition chamber 131B, the second mask supply chamber 142B may be disposed on the left side of the second deposition chamber 132B.

The station 150B may be connected to the mask supply chamber 140B in any one of various suitable ways. For example, the station 150B may be connected to both the first mask supply chamber 141B and the second mask supply chamber 142B. Alternatively, the station 150B may be individually connected to each of the first mask supply chamber 141B and the second mask supply chamber 142B. However, the following will focus on a case where the station 150B is individually connected to each of the first mask supply chamber 141B and the second mask supply chamber 142B, for convenience of explanation.

The station 150B may include a first station 151B that is connected to the first mask supply chamber 141B (and, e.g., not the second mask supply chamber 142B) and a second station 152B that is connected to the second mask supply chamber 142B (and, e.g., not the first mask supply chamber 141B). In this case, the first station 151B and the second station 152B are the same as or similar to the station 150 of the embodiments of FIGS. 1 through 3, and thus a detailed explanation thereof may not be given.

An operation of the apparatus 100B will now be explained. First, the substrate 210 may be introduced into the first transfer chamber 121B through the loading chamber 110B, and then may be conveyed to the first deposition chamber 131B. In this case, the substrate 210 on which deposition has been completed may be conveyed through the first robot arm R1 from the first deposition chamber 131B to the first transfer chamber 121B, and the mask M that has been used in the first deposition chamber 131B may be seated on a shuttle that is moved from the first mask supply chamber 141B and may be conveyed to the first mask supply chamber 141B. Also, a new mask M may be conveyed from the first station 151B through the first mask supply chamber 141B to the first deposition chamber 131B. A new substrate 210 may be conveyed from the first transfer chamber 121B to the first deposition chamber 131B, and a deposition process may be performed on the substrate 210 in the first deposition chamber 131B.

The substrate 210 on which the deposition process has been completed in the first deposition chamber 131B may be conveyed from the first deposition chamber 131B through the first transfer chamber 121B to the connection chamber 160B. The substrate 210 may be conveyed from the connection chamber 160B through the second transfer chamber 122B to the second deposition chamber 132B.

In this case, the mask M that has been used in the second deposition chamber 132B may be conveyed to the second mask supply chamber 142B as described above, and the substrate 210 on which deposition has been completed may be conveyed by the second robot arm R2 from the second deposition chamber 132B to the second transfer chamber 122B. Also, a new mask M may be conveyed from the second mask supply chamber 142B to the second deposition chamber 132B. Next, a deposition process may be performed in the second deposition chamber 132B.

The substrate 210 on which the deposition process has been completed in the second deposition chamber 132B may be conveyed from the second deposition chamber 132B through the second transfer chamber 122B to the unloading chamber 170B.

Accordingly, the apparatus 100B and a method of manufacturing the display device 200 may reduce a time taken to manufacture the display device 200 during a deposition process and may simplify a process of manufacturing the display device 200.

In the apparatus 100 and the method of manufacturing the display device 200, because the robot arm R that is provided in each of the first transfer chamber 121B and the second transfer chamber 122B may not convey the mask M, a load applied to the robot arm R may be reduced or minimized.

As described above, according to an apparatus and a method of manufacturing a display device of the one or more of the above exemplary embodiments, a lifespan of the apparatus may be increased.

According to the apparatus and the method of manufacturing the display device of the one or more of the above exemplary embodiments, because a substrate and a mask are separately moved, when a large display device is to be manufactured, the mask may be transferred.

According to the apparatus and the method of manufacturing the display device of the one or more of the above exemplary embodiments, because a structure and a process for conveying a substrate and a mask are simplified, a process time may be reduced.

According to the apparatus and the method of manufacturing the display device of the one or more of the above exemplary embodiments, because a robot arm of a transfer chamber conveys only a substrate, a lifespan of the robot arm may be increased and a failure rate may be reduced.

It will be understood that, although the terms "first", "second", "third", etc., may be used herein to describe various elements, components, regions, layers and/or sections, these elements, components, regions, layers and/or sections should not be limited by these terms. These terms are used to distinguish one element, component, region, layer or section from another element, component, region, layer or section. Thus, a first element, component, region, layer or section discussed below could be termed a second element, component, region, layer or section, without departing from the spirit and scope of the inventive concept.

Spatially relative terms, such as "beneath", "below", "lower", "under", "above", "upper" and the like, may be used herein for ease of description to describe one element or feature's relationship to another element(s) or feature(s) as illustrated in the figures. It will be understood that the spatially relative terms are intended to encompass different orientations of the device in use or in operation, in addition to the orientation depicted in the figures. For example, if the device in the figures is turned over, elements described as "below" or "beneath" or "under" other elements or features would then be oriented "above" the other elements or features. Thus, the example terms "below" and "under" can encompass both an orientation of above and below. The device may be otherwise oriented (e.g., rotated 90 degrees or at other orientations) and the spatially relative descriptors used herein should be interpreted accordingly. In addition, it will also be understood that when a component is referred to as being "between" two components, it can be the only component between the two components, or one or more intervening components may also be present.

The terminology used herein is for the purpose of describing particular embodiments and is not intended to be limiting of the inventive concept. As used herein, the singular forms "a" and "an" are intended to include the plural forms as well, unless the context clearly indicates otherwise. It will be further understood that the terms "include," "including," "comprises," and/or "comprising," when used in this specification, specify the presence of stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items. Expressions such as "at least one of," when preceding a list of elements, modify the entire list of elements and do not modify the individual elements of the list. Further, the use of "may" when describing embodiments of the inventive concept refers to "one or more embodiments of the inventive concept." Also, the term "exemplary" is intended to refer to an example or illustration.

It will be understood that when an element or layer is referred to as being "on", "connected to", "coupled to", or "adjacent to" another element or layer, it can be directly on, connected to, coupled to, or adjacent to the other element or layer, or one or more intervening elements or layers may be present. When an element or layer is referred to as being "directly on," "directly connected to", "directly coupled to", or "immediately adjacent to" another element or layer, there are no intervening elements or layers present.

As used herein, the term "substantially," "about," and similar terms are used as terms of approximation and not as terms of degree, and are intended to account for the inherent variations in measured or calculated values that would be recognized by those of ordinary skill in the art.

As used herein, the terms "use," "using," and "used" may be considered synonymous with the terms "utilize," "utilizing," and "utilized," respectively.

Sizes of elements in the drawings may be exaggerated for convenience of explanation. In other words, because sizes and thicknesses of elements in the drawings are arbitrarily illustrated for convenience of explanation, the following embodiments are not limited thereto.

When a certain embodiment may be implemented differently, a specific process order may be performed differently from the described order. For example, two consecutively described processes may be performed substantially at the same time or performed in an order opposite to the described order.

While the inventive concept has been particularly shown and described with reference to exemplary embodiments thereof, the embodiments are provided for the purposes of illustration and it will be understood by those of ordinary skill in the art that various suitable modifications and equivalent other embodiments may be made from the inventive concept. Accordingly, the true technical scope of the inventive concept is defined by the technical spirit of the appended claims, and equivalents thereof.

What is claimed is:

1. An apparatus for manufacturing a display device, the apparatus comprising:
   a loading chamber configured to receive a substrate from outside;
   a transfer chamber connected to the loading chamber and comprising a robot arm configured to transport the substrate;
   a deposition chamber connected to the transfer chamber and configured to deposit a deposition material onto the substrate after the substrate is transported to the deposition chamber from the transfer chamber;
   a mask supply chamber connected to the deposition chamber and configured to supply, to the deposition chamber, one of a plurality of masks stacked in the mask supply chamber; and
   a station connected to the mask supply chamber and configured to supply the plurality of masks, one by one, to the mask supply chamber,
   wherein the mask is supplied directly from the mask supply chamber to the deposition chamber.

2. The apparatus of claim 1, wherein the mask supply chamber comprises a cassette configured to hold the plurality of masks and configured to move upward and downward.

3. The apparatus of claim 1, wherein the station comprises:
   a station chamber having a space therein;
   a first cassette configured to receive the plurality of masks, the first cassette being in the station chamber; and
   a first cassette mover in the station chamber and configured to move the first cassette.

4. The apparatus of claim 1, further comprising a first mask mover in the mask supply chamber, wherein the first mask mover is configured to transport one of the plurality of masks from the station to the mask supply chamber or to transport one of the plurality of masks from the mask supply chamber to the station.

5. The apparatus of claim 1, wherein a pressure in the mask supply chamber is varied between an atmospheric pressure and a pressure in a vacuum state.

6. The apparatus of claim 1, wherein the transfer chamber comprises:
   a first transfer chamber; and
   a second transfer chamber spaced from the first transfer chamber and connected to the first transfer chamber via a connection chamber, and
   wherein the deposition chamber comprises:
   a first deposition chamber connected to the first transfer chamber; and
   a second deposition chamber connected to the second transfer chamber and spaced from the first deposition chamber.

7. The apparatus of claim 6, wherein the mask supply chamber comprises:
   a first mask supply chamber connected to the first deposition chamber; and
   a second mask supply chamber connected to the second deposition chamber.

8. The apparatus of claim 6, wherein the mask supply chamber is connected to both the first deposition chamber and the second deposition chamber.

9. The apparatus of claim 1, wherein the mask supply chamber comprises a shuttle configured to receive the plurality of masks, and is configured to transport one of the plurality of masks loaded thereon.

10. The apparatus of claim 9, wherein the shuttle is configured to move into the mask supply chamber and the deposition chamber.

11. A method of manufacturing a display device, the method comprising:
   transporting a substrate from a transfer chamber to a deposition chamber;
   transporting, directly from a mask supply chamber to the deposition chamber, a mask selected from among a plurality of masks that are stacked in the mask supply chamber connected to the deposition chamber and aligning the selected mask with the substrate; and
   discharging a deposition material from a deposition source of the deposition chamber and depositing the deposition material through the selected mask and onto the substrate.

12. The method of claim 11, further comprising varying a pressure in the mask supply chamber between an atmospheric pressure and a pressure in a vacuum state.

13. The method of claim 11, further comprising supplying the mask to the mask supply chamber via a station connected to the mask supply chamber.

14. The method of claim 13, wherein the station comprises:
   a station chamber having a space therein;
   a first cassette configured to receive the plurality of masks, the first cassette being in the station chamber; and a first cassette mover in the station chamber and configured to move the first cassette.

15. The method of claim 11, wherein the transfer chamber comprises:
   a first transfer chamber; and
   a second transfer chamber spaced from the first transfer chamber, wherein a connection chamber connects the first transfer chamber and the second transfer chamber, and
   wherein the deposition chamber comprises:
      a first deposition chamber connected to the first transfer chamber; and
      a second deposition chamber connected to the second transfer chamber and spaced apart from the first deposition chamber.

16. The method of claim 15, wherein the mask supply chamber is connected to both the first deposition chamber and the second deposition chamber.

17. The method of claim 15, wherein the mask supply chamber comprises:
   a first mask supply chamber connected to the first deposition chamber; and
   a second mask supply chamber connected to the second deposition chamber.

18. The method of claim 11, wherein the transporting of the selected mask comprises loading the selected mask on a shuttle comprised in the mask supply chamber and transporting the selected mask loaded on the shuttle.

19. The method of claim 18, wherein the transporting of the selected mask comprises moving the shuttle into the mask supply chamber and the deposition chamber.

* * * * *